(12) United States Patent
Desbonnets et al.

(10) Patent No.: US 10,943,815 B2
(45) Date of Patent: Mar. 9, 2021

(54) STRUCTURE FOR RADIOFREQUENCY APPLICATIONS

(71) Applicant: Soitec, Bernin (FR)

(72) Inventors: Eric Desbonnets, Lumbin (FR); Ionut Radu, Crolles (FR); Oleg Kononchuk, Theys (FR); Jean-Pierre Raskin, Belgique (FR)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 16/308,602

(22) PCT Filed: Jun. 6, 2017

(86) PCT No.: PCT/FR2017/051418
§ 371 (c)(1),
(2) Date: Dec. 10, 2018

(87) PCT Pub. No.: WO2017/212160
PCT Pub. Date: Dec. 14, 2017

(65) Prior Publication Data
US 2019/0157137 A1 May 23, 2019

(30) Foreign Application Priority Data
Jun. 8, 2016 (FR) ..................................... 1655266

(51) Int. Cl.
*H01L 21/762* (2006.01)
*H01L 21/84* (2006.01)
(Continued)

(52) U.S. Cl.
CPC .. *H01L 21/76283* (2013.01); *H01L 21/02002* (2013.01); *H01L 21/76224* (2013.01);
(Continued)

(58) Field of Classification Search
CPC ......... H01L 21/76283; H01L 21/76244; H01L 21/76264; H01L 29/78603; H01L 27/1218
See application file for complete search history.

(56) References Cited

U.S. PATENT DOCUMENTS 6,391,792 B1 * 5/2002 Jang ................. H01L 21/31053
257/E21.244
2009/0179027 A1 * 7/2009 Vartabedian ............ F23Q 7/001
219/548

(Continued)

OTHER PUBLICATIONS

Kononchuk et al., Silicon-on-insulator (SOI) Technology, manufacture and applications, applications, points 10.7 and 10.8, from Woodhead Publishing, 2014, abstract only.
Joseph et al., A High-Resistivity SiGe BiCMOS Technology for WiFi RF Front-End-IC Solutions, 2013 IEEE Bipolar-Bicmos Circuits and Technology Meeting, (Sep. 30, 2013), pp. 231-234.
International Written Opinion for International Application No. PCT/FR2017/051418 dated Oct. 18, 2017, 8 pages.

(Continued)

*Primary Examiner* — Hsien Ming Lee
(74) *Attorney, Agent, or Firm* — TraskBritt

(57) ABSTRACT

A substrate for microelectronic radiofrequency devices includes a carrier substrate made of a first semiconductor material having a resistivity higher than 500 ohms-cm; a plurality of trenches in the carrier substrate, which trenches are filled with a second material, and defining on a first side of the carrier substrate a plurality of first zones made of a first material and at least one second zone made of a second material. The second material has a resistivity higher than 10 kohms-cm, and the first zones have a maximum dimension smaller than 10 microns and are insulated from one another by the second zone.

19 Claims, 6 Drawing Sheets

(51) Int. Cl.
*H01L 27/12* (2006.01)
*H01L 21/02* (2006.01)
*H01L 29/786* (2006.01)
*H01L 29/06* (2006.01)

(52) U.S. Cl.
CPC .......... *H01L 21/84* (2013.01); *H01L 27/1203* (2013.01); *H01L 27/1218* (2013.01); *H01L 29/0649* (2013.01); *H01L 29/78603* (2013.01); *H01L 21/76264* (2013.01)

(56) References Cited

U.S. PATENT DOCUMENTS

| | | |
|---|---|---|
| 2012/0025345 A1 | 2/2012 | Botula et al. |
| 2012/0266116 A1* | 10/2012 | Ding .................... H01Q 1/2283 716/101 |
| 2014/0175598 A1* | 6/2014 | Li ....................... H01L 29/0649 257/507 |
| 2014/0210038 A1 | 7/2014 | Li |

OTHER PUBLICATIONS

International Search Report for International Application No. PCT/FR2017/051418 dated Oct. 18, 2017, 3 pages.
Fernandez et al., A CMOS Compatible Process for Improved RF Performance on Highly Doped Substrates, Signal Propagation on Interconnects, 2005 Proceedings 9th IEEE Works, (May 10-13, 2005), pp. 167-170.

* cited by examiner

STRUCTURE FOR RADIOFREQUENCY APPLICATIONS

CROSS-REFERENCE TO RELATED APPLICATIONS

This application is a national phase entry under 35 U.S.C. § 371 of International Patent Application PCT/FR2017/051418, filed Jun. 6, 2017, designating the United States of America and published as International Patent Publication WO 2017/212160 A1 on Dec. 14, 2017, which claims the benefit under Article 8 of the Patent Cooperation Treaty to French Patent Application Serial No. 1655266, filed Jun. 8, 2016.

TECHNICAL FIELD

The present disclosure relates to the field of integrated radio frequency devices.

BACKGROUND

For most applications involving the transmission or reception of radio frequency signals (10 MHz to 100 GHz), the devices require a substrate that increasingly fulfills demanding specifications, particularly driven by the changing standards of mobile telephony (2G, 3G, LTE, LTE Advanced, LTE Advanced PRO, 5G . . . ). The properties of substrate materials must specifically ensure:

- Low insertion losses (low signal attenuation) and good linearity (low signal distortion causing harmonics), typically by presenting an effective resistivity over a wide range of frequencies, greater than 1000 ohms-cm;
- Stability of these temperature performances, particularly within the range of use of devices (−40° C. to 150° C.);
- Sufficient heat dissipation capacity, typically due to a thermal conductivity greater than 20 W/m·K;
- A weak capacitive coupling between the active layer and the support substrate, typically thanks to a dielectric permittivity equal to or lower than that of silicon ($\varepsilon_{silicon}=11$).

Moreover, in order to meet high volume requirements, the substrate must be compatible with the semiconductor industry and particularly with CMOS silicon manufacturing lines. Of course, it must also have a competitive cost to be adopted by consumer applications, particularly in the field of telecommunications (telephony and cellular network, WiFi connectivity, Bluetooth). Space and military applications are particularly sensitive to performance and temperature resistance.

Radio frequency (RF) devices such as antenna switches and adaptors, power amplifiers, low noise amplifiers or even passive components (R, L, C) can be developed on different types of substrates.

For example, silicon-on-sapphire substrates known as SOS (silicon on sapphire) are known which allow the components produced using microelectronic technologies in the surface layer of silicon to benefit from the insulating properties of sapphire substrate materials, irrespective of temperature, its conductivity that is greater than 20 W/m·K and its permittivity that is less than 11. For example, the antenna switches and power amplifiers manufactured on this type of substrate exhibit very good factors of merit but are mainly used for niche applications because of the too high overall cost of the solution.

Also known are high-resistivity silicon substrates comprising a support substrate, a trapping layer (a few hundred nanometers to a few microns thick) laid out on the support substrate, a dielectric layer laid out on the trapping layer, and a semiconductor layer laid out on the dielectric layer. The support substrate usually has a resistivity greater than 1 ohm-cm. The trapping layer may comprise undoped polycrystalline silicon. The combination of a high resistivity silicon support substrate and a trapping layer, based on the state of the art, makes it possible to eliminate the parasitic conducting layer usually present under the oxide layer buried in the SOI HR (Silicon on insulator with high resistivity silicon support substrate). The skilled person will find a review of the performance of RF devices manufactured on a high resistivity semiconductor substrate known in the Background of the Invention in "Silicon-on-insulator (SOI) Technology, Manufacture and Applications," points 10.7 and 10.8, Oleg Kononchuk and Bich-Yen Nguyen, Woodhead Publishing.

Nevertheless, a poly-silicon trapping layer has the disadvantage of undergoing partial recrystallization during high temperature heat treatment steps, which contributes to reducing the density of traps in the layer. The degradation of the RF device performance related to this decrease in the density of traps may be prohibitive for certain applications. Moreover, these substrates struggle to ensure the stability of the RF performances over the entire range of operating temperatures, particularly above 100° C. Their resistivity falls considering the generation of thermal carriers in the support substrate and the coupling device/substrate becomes a major contributor to signal attenuation and distortion. Performance degradation has also been observed when the temperature drops below 0° C. Finally, permittivity will remain very close to that of silicon (about 11).

Other support substrates, such as aluminum nitride or silicon carbide, would meet the RF properties specifications but are not compatible with the standard semiconductor industry. Their use as a support substrate for transferring the final layer of devices is conceivable. Nevertheless, the cost of these specific materials combined with that of the circuit transfer technologies is still too high for a mass adoption of these solutions.

BRIEF SUMMARY

A purpose of the present disclosure is thus to propose a substrate suitable for radiofrequency applications, remedying all or part of the disadvantages of the prior art.

The disclosure, in particular, relates to a substrate for microelectronic radiofrequency devices comprising:
- A support substrate made of a first semiconductor material with a resistivity greater than 500 ohms-cm,
- A plurality of trenches in the support substrate, filled with a second material, and defining on a first side of the support substrate, a plurality of first zones of the first material and at least one second zone of the second material.

The substrate is remarkable in that:
- The second material has a resistivity greater than 10 kohms-cm;
- The first zones have a maximum dimension of less than 10 microns and are isolated from one another by the second zone.

The role of the upper part of the substrate according to the disclosure comprising the trenches filled with the second material is to block the movement of the movable charges which can be generated in the vicinity of the first side of the support substrate so that the latter maintains a high and stable resistivity level.

The restriction on the maximum dimension of the first zones and the insulation of these first zones from one another by at least one second zone made of a highly resistive material, make it possible to block the movement of potential moving charges in the first zone semiconductor material constituting the support substrate, in the upper part. In this upper part, the charges have to travel a greater distance to pass from one first zone to another first neighboring zone by bypassing the trenches filled with the second material. The effective resistivity of the substrate is thus increased.

This makes it possible to specifically eliminate the harmful effects of a parasitic conduction in a substrate on which RF devices are made.

According to advantageous features of the disclosure, taken alone or in combination:
 the surface density of the first zones and of the second zone confers on an upper part of the substrate extending from the first side of the support substrate to a depth of the trenches an average thermal conductivity greater than 20 W/m·K, an average dielectric permittivity less than the permittivity of the first material and a resistivity higher than the resistivity of the first material;
 the second zone forms a mesh on the first side of the support substrate;
 the trench depth is between 1 micron and 100 microns;
 the first material constituting the support substrate is silicon;
 the second material filling the trenches is selected from the group consisting of a silicon oxide, a silicon nitride, a silicon oxynitride, an aluminum nitride, an amorphous or polycrystalline silicon, a carbon-rich silicon, a polymer or even a gas;
 the plurality of trenches is partially filled with the second material and partially with a third material of a nature or a composition different from the second material;
 the third material is selected from the group consisting of a silicon oxide, a silicon nitride, a silicon oxynitride, an aluminum nitride, an amorphous or polycrystalline silicon, a carbon-rich silicon, a polymer or even a gas;
 the second or the third material has the properties of trapping movable electrical charges that can be generated in the first material;
 the substrate comprises a dielectric layer laid out on the first side of the support substrate;
 the substrate comprises an additional layer between the dielectric layer and the first side of the support substrate, composed of the third material;
 the dielectric layer is made up of a material chosen from a silicon oxide, a silicon nitride, a silicon oxynitride, or an aluminum nitride;
 the dielectric layer is composed of the second material;
 the substrate comprises a useful layer laid out on the first side of the support substrate;
 the dielectric layer is sandwiched between the useful layer and the first side of the support substrate; and
 the useful layer is composed of a material chosen from semiconducting, insulating or conductive materials or piezoelectric materials.

The disclosure also relates to a structure of microelectronic radiofrequency devices comprising:
 a substrate such as above;
 a layer of microelectronic devices laid out on the substrate.

According to beneficial features of the disclosure, taken alone or in combination, the microelectronic device is an antenna switch or adaptor or a power amplifier or a low noise amplifier or a passive component or a radiofrequency MEMS component or a radiofrequency filter or another circuit operating at high frequencies.

The disclosure further relates to a substrate for microelectronic radiofrequency devices comprising:
 providing a support substrate made of a first semiconductor material with a resistivity greater than 500 ohms-cm,
 Mask etching of a plurality of trenches extending from the first side of the support substrate to a determined depth; and
 Filling the plurality of trenches with a second material to form first areas of first material on the first side and at least one second zone of the second material;

The method is remarkable in that the first zones, whose maximum dimension is less than 10 microns, are insulated from one another by the second zone whose second material has a resistivity greater than 10 kohms-cm.

Finally, the disclosure relates to a substrate for microelectronic radiofrequency devices comprising:
 Providing a support substrate made of a first semiconductor material with a resistivity greater than 500 ohms-cm;
 The local coating, according to a mask, of a plurality of pillars formed from the first material and of a given height, on the support substrate; an upper surface of the pillars defining a first side of the substrate and the pillars being insulated from each other by a plurality of trenches extending from the first side of the substrate to a depth defined by the determined height of the pillars;
 Filling the plurality of trenches with a second material to form first areas of first material on the first side and at least one second zone of the second material.

The method is remarkable in that the first zones, whose maximum dimension is less than 10 microns, are insulated from one another by the second zone whose second material has a resistivity greater than 10 kohms-cm.

BRIEF DESCRIPTION OF THE DRAWINGS

Other characteristics and advantages of the disclosure will emerge from the detailed description that follows while referring to the accompanying drawings in which.

DETAILED DESCRIPTION

In the descriptive part, the same references in the figures may be used for elements of the same type. The figures are schematic representations which, for the sake of clarity, are not to scale. In particular, the thicknesses of the layers along the Z axis are not to scale with respect to the lateral dimensions along the X and Y axes, and the relative thicknesses of the layers between them are not necessarily respected in the figures.

Figure 1:
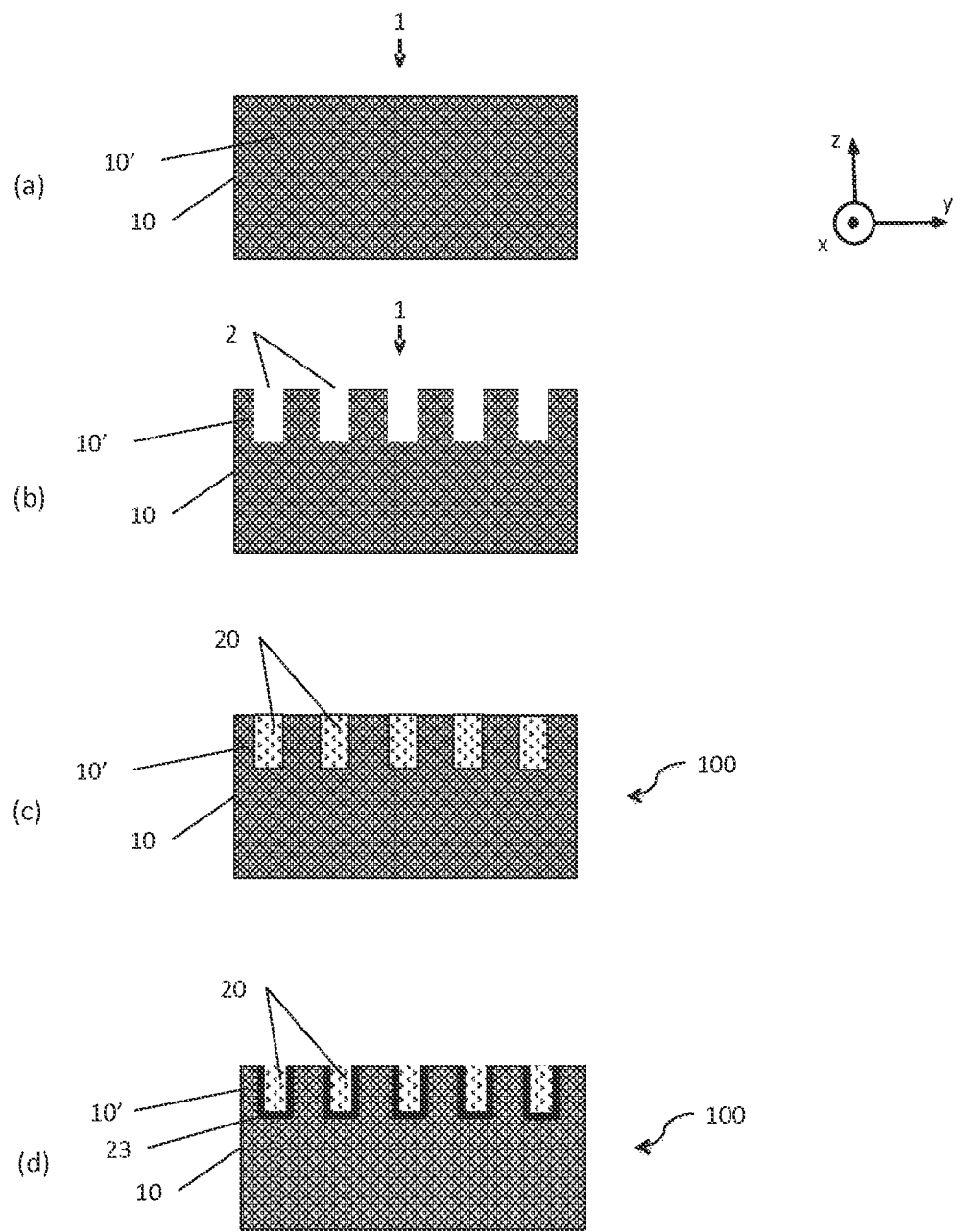
FIG. 1, Panels (a) through (d), show steps of the method of manufacturing a substrate according to the disclosure.

The disclosure relates to a method for producing a substrate suitable for microelectronic radiofrequency devices, shown in FIG. 1, Panels (a) through (c). The method includes providing a support substrate 10 with a first semiconductor material 10' whose resistivity is greater than 500 ohms-cm (FIG. 1, Panel (a)). Advantageously, the resistivity of the first material will even be chosen to be greater than 1,000 ohms-cm, or even greater than 3,000 ohms-cm. As illustration, the first semiconductor material 10' may be monocrystalline silicon.

According to the disclosure, the method also includes a phase of etching the first side 1 of the support substrate 10, according to a mask, with a plurality of trenches 2 extending from the first side 1 of the support substrate 10 to a determined depth. This etching phase may be preceded by a photolithography phase conventionally implemented to define the patterns to be etched according to the mask and to protect the patterns which are not to be etched by a masking layer. The etching may be carried out by known techniques of chemical etching, wet or dry. The masking layer deposited on the first side 1 of the support substrate 10 can then be removed, thus obtaining support substrate 10 comprising the trenches 2, illustrated in FIG. 1, Panel (b).

According to a variant, the trenches 2 may be produced by the local coating, according to a mask, of a plurality of pillars made up of the first material and of a given height on the support substrate 10. After coating, the upper surface of the pillars defines a first side of support substrate 10 and the pillars are insulated from each other by a plurality of trenches extending from the first side to a depth defined by the height of the pillars. Such local coating may, for example, be carried out by selective epitaxy: in this case, the areas to be free of coating are covered by a masking layer (in particular silicon oxide or nitride). The epitaxy then takes place locally, on the unmasked areas. After epitaxy, the masking layer present at the bottom of the trenches can be retained or removed by wet or dry etching.

The manufacturing process further comprises a phase of filling the plurality of trenches 2 with a second material 20. The second material 20 will be chosen for its electrical properties: it will in particular have a resistivity greater than 10 kohms-cm. The second material 20 may be chosen from electrical insulators, such as silicon oxide, silicon nitride, a silicon oxynitride or aluminum nitride. It may alternatively be chosen from highly resistive semiconductors such as amorphous, polycrystalline, intrinsic silicon or with chosen compositions, for example, to stabilize the temperature resistivity (in particular if it is carbon-doped or carbon-rich silicon). Finally, the second material 20 may also be chosen from insulating polymers.

As illustration, the phase of filling the trenches 2 can be carried out by chemical, vapor or liquid coating or by heat treatment (for example, by thermal oxidation in the case of filling with silicon oxide). Advantageously, the second material 20 can withstand high heat treatments (notably up to 1000° C. or even 1200° C.) required for the subsequent fabrication of certain RF devices. In some cases, the second material 20 will only have to undergo medium or low temperature treatments (less than 500° C., or even 350° C.) during the subsequent steps of manufacturing the devices on substrate 100: this will allow other options for the second material 20, such as polymers, for example, deposited by "sol-gel"-type techniques (spin-coating).

The substrate 100 obtained at this stage of the manufacturing process is illustrated in FIG. 1, Panel (c).

According to a variant illustrated in FIG. 1, Panel (d), the trenches 2 may be partially filled by the second material 20 and partially by a third material 23, of different nature and/or composition from the second material 20. The third material 23 may be chosen from the materials stated as being able to constitute the second material 20. Advantageously, the third material 23 will first be deposited on the internal walls of the trenches 2; the second material 20 then being deposited on the third material 23 to fill the trenches 2. As an example and without being considered as limiting, a first polycrystalline silicon coat may be made on the internal walls of the trenches 2; a second silicon nitride coating can then be made on the polycrystalline silicon to fill the trenches 2. In this example, the third material 23 is made of polycrystalline silicon and the second material 20 is made of silicon nitride.

According to another variant, the trenches 2 can be kept in the state of cavities, that is to say, without filling with any solid material. The second material 20 is in this case made up of a gas or a gaseous mixture, for example, air or other gases, which can be introduced later during the manufacturing process according to the disclosure.

According to this variant, a third material 23 may also be deposited on the internal walls of the trenches 2, the major part of the trench 2 being otherwise filled only with a gas or a gaseous mixture.

Figure 2:
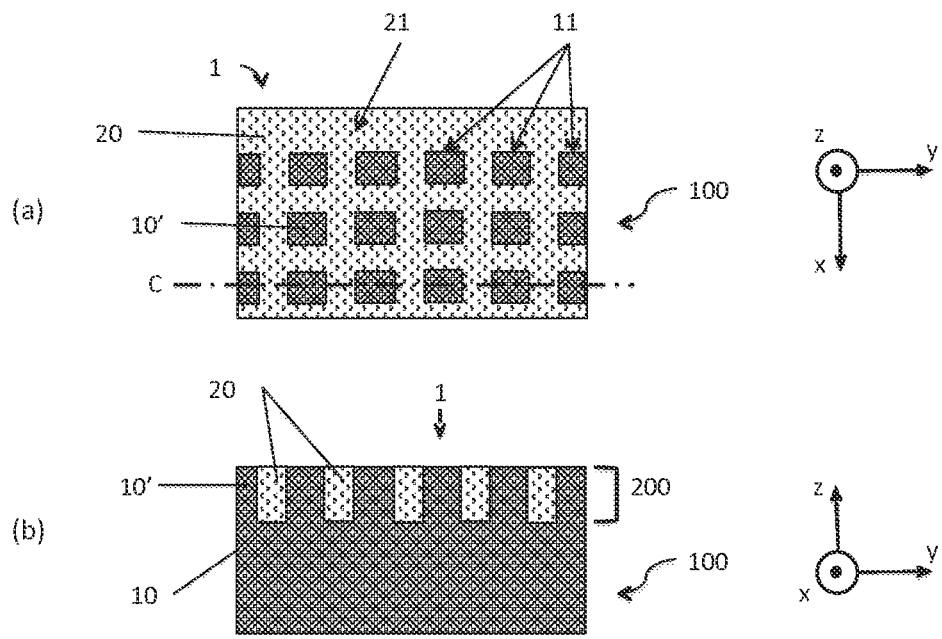
FIGS. 2 and 3 show two variants of substrates according to the disclosure, in plan view and in cross-section.

FIG. 2, Panel (a), illustrates a substrate 100 in plan view, that is to say, according to the first side 1. Note that the cross-sectional view of the same substrate 100, along a sectional plan C illustrated in FIG. 2, Panel (a), is presented in FIG. 2, Panel (b).

The trenches 2 filled with the second material 20 to form the first zones 11 of the first semiconductor material 10' on the first side 1 and at least one second zone 21 of the second material 20. The substrate 100 is remarkable in that the first zones 11 have a maximum dimension of less than 10 microns. According to other advantageous embodiments, the maximum dimension of the first zones 11 will even be less than 8 microns, 5 microns or even 2 microns.

The substrate 100 is also remarkable in that the first zones 11 are isolated from each other by the second zone 21 made of the second material 20, that is to say they are not in contact with each other. Advantageously, they are electrically insulated from each other, the second material 20 having a resistivity greater than 10 kohms-cm. Advantageously, the second material 20 or the third material 23 when used has properties of trapping movable electrical charges that can be generated in the first semiconductor material 10'.

Figure 3:
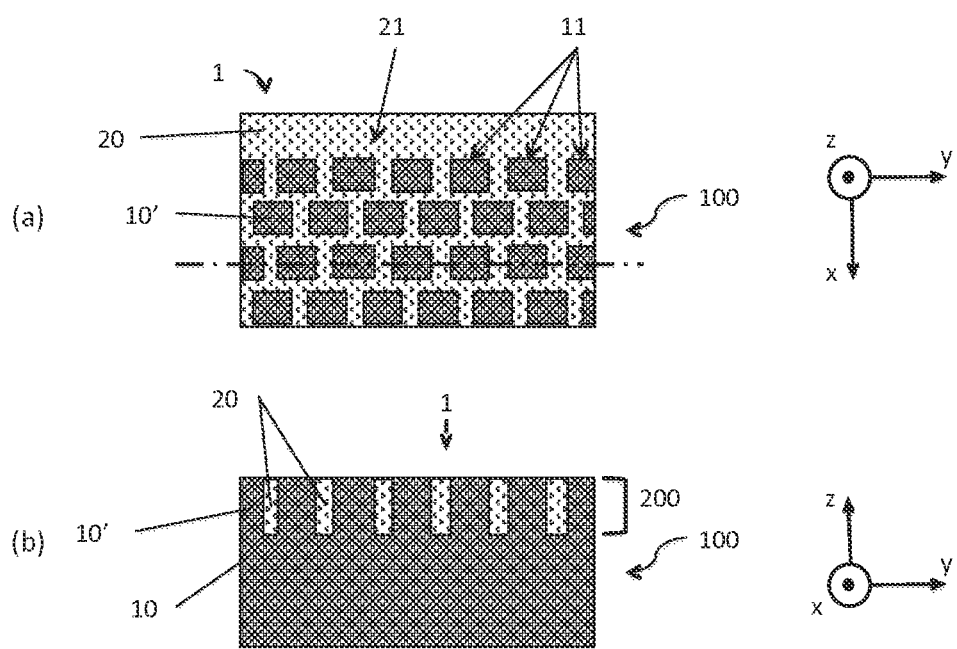

According to the examples shown in FIG. 2, Panel (a), and FIG. 3, Panel (a), the at least one second zone 21 forms a mesh on the first side 1 of the support substrate 10 which separates each of the first zones 11. Depending on the shape of this mesh and the dimensions of the zones 11, 21, the surface density of the first zones 11 may be different. Advantageously, the surface density of the first zones 11 will be chosen so as to confer on an upper part 200 of substrate 100, extending from the first side 1 of the support substrate 10 to the depth of the trenches 2, a mean thermal conductivity greater than 20 W/m·K, an average dielectric permittivity lower than the permittivity of the first semiconductor material 10' and an effective resistivity greater than the resistivity of the first semiconductor material 10' or at least greater than 1000 ohms-cm.

To illustrate, the first zones 11 may cover between 20 and 70% of the surface of the first side 1 of the support substrate 10, the second zone 21 covering the additional surface.

The trenches 2 have a depth of between 1 micron and 100 microns. For a microelectronic device (which will be laid out laterally above the upper part 200 of substrate 100) of lateral dimension a, it can be considered that the electric field will penetrate to a depth of about a/3 in substrate 100. Thus, for an RF antenna switching-type device with a typical lateral dimension of 100 microns, the depth of the trenches 2 must be about 30-40 microns, so that the electric field sees only the upper part 200 of substrate 100. The electrical features (effective resistivity, permittivity) of the upper part 200 will then condition the performance of the microelectronic radiofrequency devices laid out above.

The known techniques of etching make it possible to produce trenches whose form factor (ratio of lateral dimension to depth) is usually between ⅕ and ⅟30. For example, the shape factor of the trenches 2 according to the disclosure will typically be between ⅕ and ⅟30: for a maximum lateral dimension of 10 microns, the depth of the trenches 2 may be between 50 and 100 microns; for a maximum lateral dimension of 1 micron, the depth may be between 5 microns and 30 microns.

Figure 4:
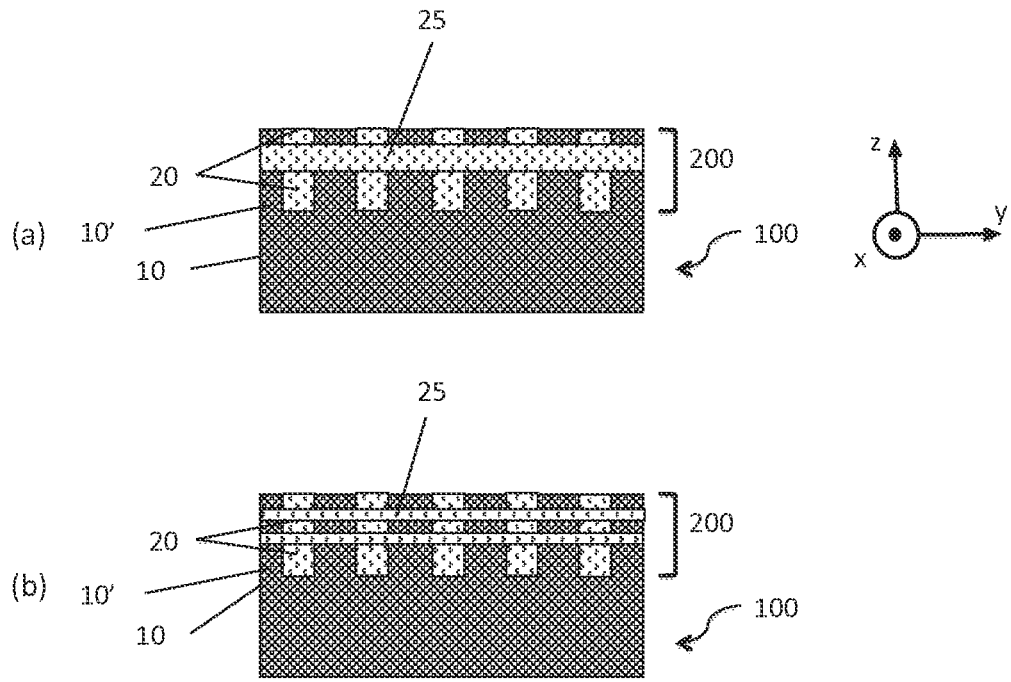
FIG. 4, Panels (a) and (b), show other variants of substrates according to the disclosure, in cross-sectional view.

FIG. 4, Panels (a) and (b), shows an alternative embodiment of substrate 100 according to the disclosure. In the upper part 200 of substrate 100, the parts made of the first semiconductor material 10' can be segmented in the direction of the depth (i.e., along the Z axis in the figures). For this purpose, at least one segmentation layer 25 of the second material 20 may be deposited over the entire surface of the first side 1 of the support substrate 10 after filling the trenches 2. This segmentation layer 25 may be, in one of the second materials 20 referred to above, identical to or different from that used to fill the trenches 2.

Subsequent steps of local coating of the first semiconductor material 10' opposite the first zones 11 and the second material 20 opposite the second zones 21 will then be carried out. These steps may be repeated as many times as necessary to achieve several segmentations in the thickness of the upper part 200.

Alternatively, the segmentation of the parts constituted by the first semiconductor material 10' in the upper part 200 may be performed by ion implantation in substrate 100. To illustrate, the species chosen from among oxygen, nitrogen, hydrogen, helium, etc., can be introduced at a given depth in order to constitute the segmentation layer 25 segmenting in depth the first semiconductor material 10' parts of the upper part 200.

Figure 5:
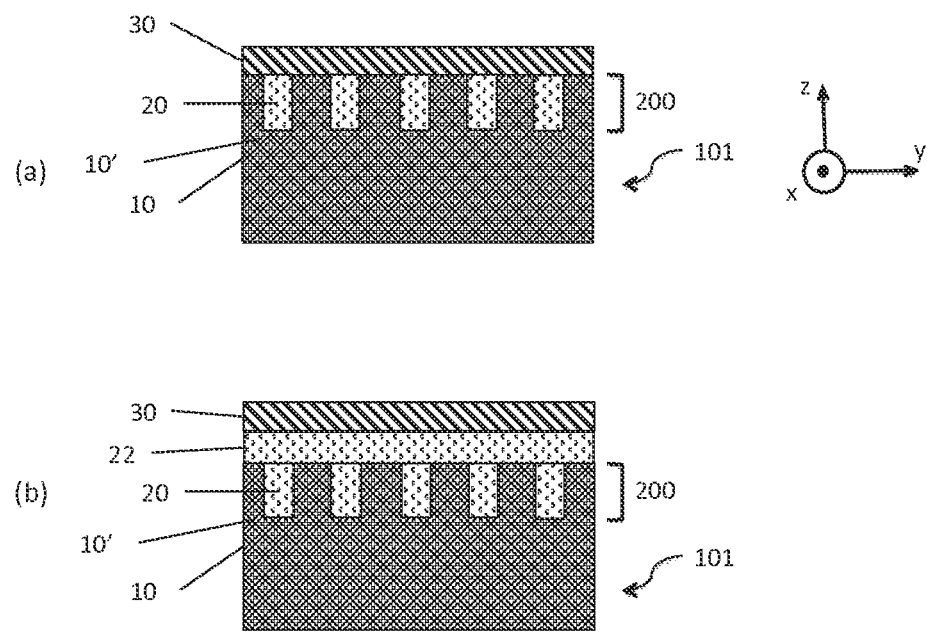
FIG. 5, Panels (a) and (b), FIG. 6, Panels (a) through (d), and FIG. 9 all show substrates according to the disclosure.

The method for manufacturing the substrate for microelectronic radiofrequency devices according to the disclosure may further comprise a formative stage of a dielectric layer 30 on the first side 1 of the support substrate 10 (FIG. 5, Panel (a)). To illustrate, its thickness may vary between a few nanometers and 3 μm. Advantageously, the dielectric layer 30 is made from a material chosen from among silicon oxide, silicon nitride, a silicon oxynitride or aluminum nitride. It may be deposited by various known chemical deposition techniques. The dielectric layer 30 may optionally be of the same nature as the second material 20.

According to a variant, illustrated in FIG. 5, Panel (b), a layer of the second material is present beneath the dielectric layer 30. In fact, during the trench 2 filling phase of the method according to the disclosure, a layer of the second material 20 may be deposited in the trenches 2 and on the first side 1 of the support substrate 10. A planarization phase of this layer (for example, a mechanical-chemical polishing) can then be carried out to reduce the surface topology, leaving a residual layer 22 in the second material 20 on the first side 1 of the support substrate 10.

According to another variant (not shown), the residual layer 22 may constitute all or part of the dielectric layer 30.

Figure 9:
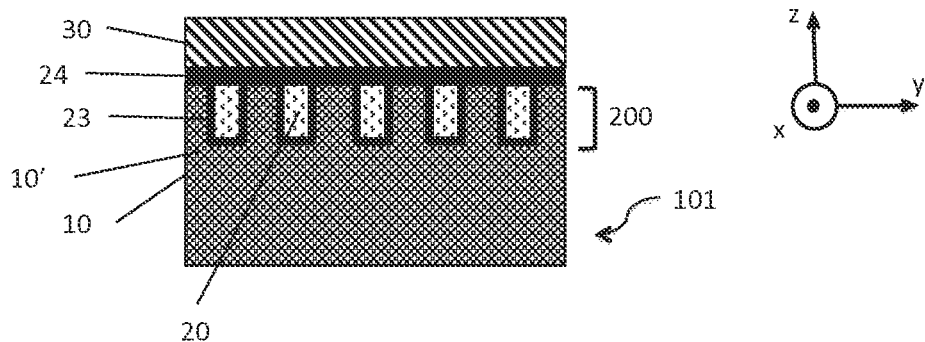

The manufacturing process may also include a formative stage of an additional layer 24 on the first side 1 of the support substrate 10 prior to the formation of the dielectric layer 30 (FIG. 9). Advantageously, this additional layer 24 is composed of the third material 23, the latter having properties of trapping mobile electrical charges (free carriers) capable of being generated in the first semiconductor material 10'.

The substrate manufacturing method for microelectronic radiofrequency devices according to the disclosure may also include a formative stage of a useful layer 40, laid out on a substrate 100 or 101 according to the disclosure.

To illustrate, the useful layer 40 is transferred by one of the thin film transfer methods well known to those skilled in the art, including:

The SMART CUT® process, based on the implantation of light hydrogen and/or helium ions in a donor substrate and a bonding, for example, by molecular bonding of this donor substrate to substrate 100 or 101; a detachment phase then makes it possible to separate a thin surface layer from the donor substrate (the useful layer), at the embrittlement level defined by the depth of implantation of the ions. Finishing steps, which may include heat treatments at high temperature, finally provide the required crystalline and surface quality to the useful layer 40. This process is particularly suitable for the manufacture of very thin useful layers, with a thickness of between a few nanometers and about 1.5 μm, for example, for silicon layers.

The SMART CUT® process followed by an epitaxial phase, making it possible in particular to obtain thicker useful layers 40, for example, from a few tens of nm to 20 μm.

Direct bonding and mechanical, chemical and/or chemical mechanical thinning processes; they consist in assembling a donor substrate by molecular bonding directly on the substrate 100 or 101 and then in thinning the donor substrate up to the desired thickness of the useful layer 40, for example, by grinding and by CMP (for "chemical mechanical polishing"). These processes are particularly suitable for transferring thick layers, for example, from a few microns to several tens of microns, and up to a few hundred microns.

The aforementioned layer transfer processes are advantageously based on a molecular adhesive bonding phase of a donor substrate (from which the active layer will be derived) and the support substrate 100, 101. In the particular case where the second material 20 filling the trenches 2 is a gas or a gaseous mixture, the atmosphere in the bonding enclosure will be controlled (composition of the gas, pressure, etc.) so that the gas trapped in the trenches 2 after the assembly of the two substrates corresponds to the second material 20 expected. Specifically, the atmosphere in the bonding chamber may be brought to a very low pressure in order to achieve a quasi-vacuum configuration in the trenches 2, this type of configuration being in some cases favorable to the mechanical strength of the superficial useful layer 40.

The useful layer 40 is made up of a material or stack of materials making it possible to implement RF devices, analogous or digital. It may thus be chosen from among semiconductor, conductive or insulating, materials depending on the type of RF devices targeted; more specifically, it may be made up of a material chosen from among the piezoelectric materials.

The useful layer 40 may, for example, be made of silicon, germanium silicon, germanium, III-V material, lithium niobate, lithium tantalate, aluminum nitride, PZT and the like.

Figure 6:
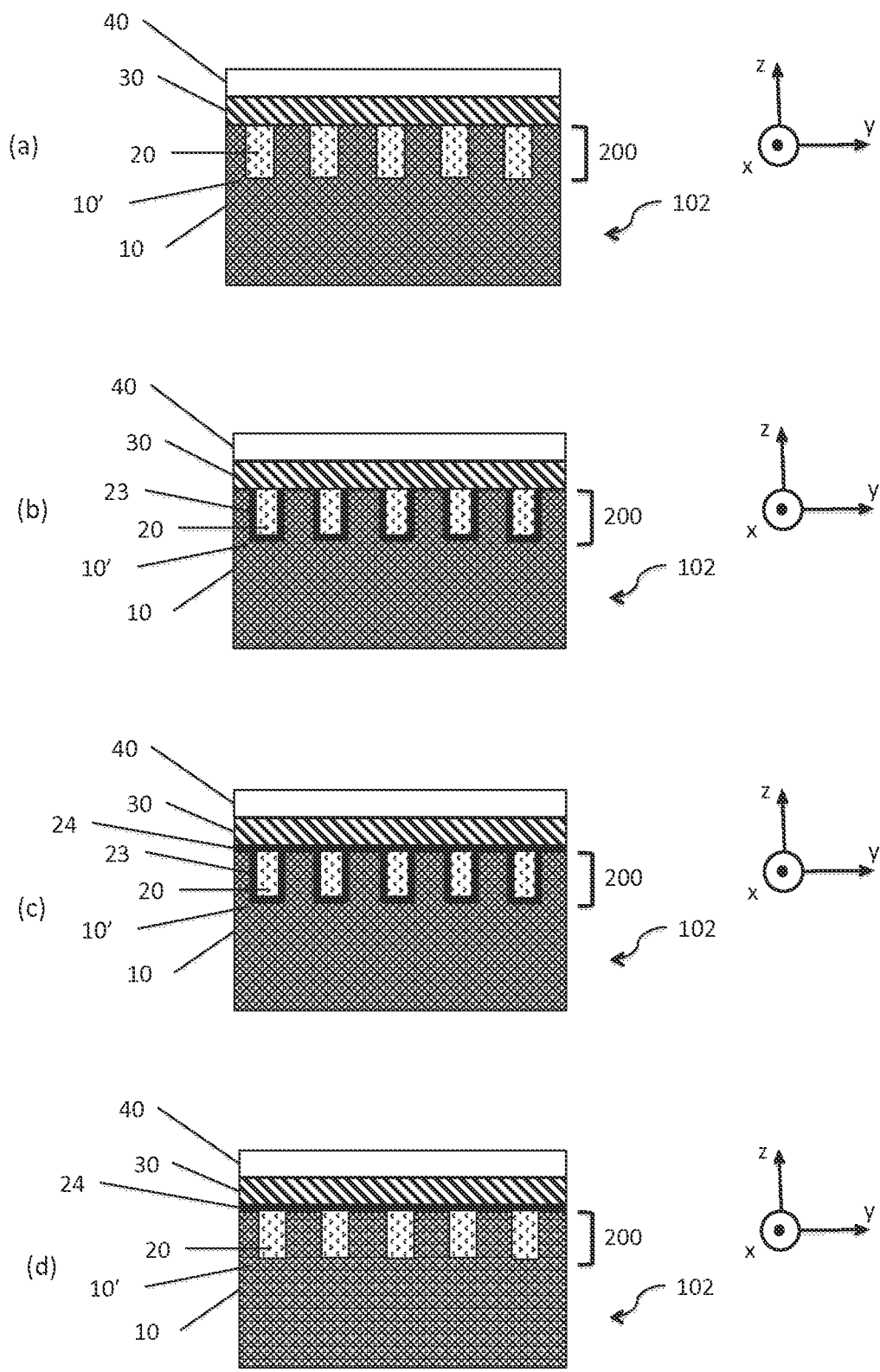

FIG. 6, Panels (a) through (c), illustrates substrates 102 according to the disclosure, comprising:

A useful layer 40,
A dielectric layer 30
A substrate 100 comprising a support substrate 10 made of a first semiconductor material 10' and:
- Trenches 2 filled with a second material 20 (FIG. 6, Panel (a));
- Trenches 2, the walls of which are lined with a third material 23, and which are filled with a second material 20 (FIG. 6, Panel (b));
- Trenches 2, the walls of which are lined by a third material 23, and which are filled with a second material 20; an additional layer 24 being sandwiched between the first side of the support substrate 10 and the dielectric layer 30 (FIG. 6, Panel (c)).

As it is well known in the field of SOI substrates for radiofrequency applications, a dielectric layer, for example, formed by a silicon oxide on a silicon carrier substrate, has positive charges. These charges are compensated for by negative charges coming from the support substrate at the interface with the dielectric layer. These charges generate a surface parasitic conducting layer in the support substrate, beneath the dielectric layer: the resistivity of the support substrate at this conducting layer then drops to around 10-100 ohms-cm. The electrical performances that are sensitive to the resistivity of the support substrate (such as the linearity of the signal, the level of insertion losses, the quality factors of the passive components, etc.) are therefore severely degraded by the presence of this conducting layer.

The role of the upper part 200 of substrate 102 is specifically to block the movement of the mobile charges generated in the vicinity of the first side of the support substrate 10 so that it retains a high and stable resistivity level.

Indeed, the restriction on the maximum dimension of the first zones 11 makes it possible to block the movement of potential mobile charges in the first semiconductor material 10' constituting the support substrate 10. The charges have to travel a greater distance to pass from one first zone 11 to another first neighboring zone 11 by bypassing the trenches 2 filled with the second material 20. The effective resistivity of the upper part 200 of substrate 102 is thus increased. This makes it possible to eliminate all or part of the harmful effects of parasitic conduction which appears under the dielectric layer in a substrate 102 comprising RF devices.

Figure 10:
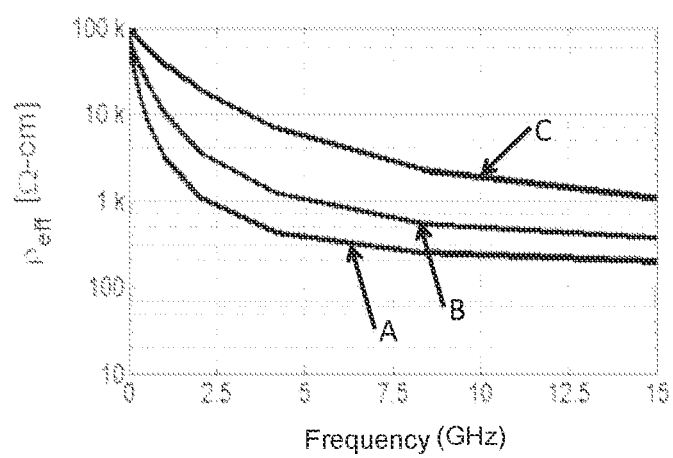
FIG. 10 shows a graph representing the effective resistivity of the substrate, depending on the operating frequency of microelectronic radiofrequency devices, in structures according to the disclosure.

To illustrate, let us take the case of a substrate 102 as illustrated in FIG. 6, Panel (b), formed of a monocrystalline silicon support substrate 10 with a nominal resistivity at 8 kohms-cm, of a deposited polycrystalline silicon as the third material 23, of a deposited silicon dioxide as the second material, the trenches 2 having a depth of 20 microns; the dielectric layer 30 is also made of silicon dioxide and the useful layer 40 is of monocrystalline silicon. FIG. 10 shows a simulation of the evolution of the effective resistivity of the upper part 200 of the support substrate 10 as a function of the operating frequency of the radiofrequency devices present in and/or on the useful layer 40. Variants A, B and C in FIG. 10 correspond to three different maximum dimensions of the first zones 11: 10 microns (A), 5 microns (B) and 2 microns (C). Variant A shows that the effective resistivity of the upper part 200 remains greater than 1,000 ohms-cm for frequencies below about 2.5 GHz. Variant B allows an effective resistivity of more than 1,000 ohms-cm to be maintained for all frequencies below 5 GHz. Finally, variant C makes it possible to obtain an effective resistivity of the upper part 200 greater than the nominal resistivity of the support substrate 10 for frequencies below 5 GHz; it also makes it possible to retain an effective resistivity of more than 1,000 ohms-cm for all frequencies below 15 GHz. The confinement in the first zones 11 of the mobile charges generated in the first semiconductor material 10' (silicon) under the dielectric layer 30 of silicon oxide thus makes it possible to increase the effective resistivity of the upper part 200 of the support substrate 10: the dimensions of the first zones 11 are reduced as the effective resistivity increases and remains high over a wide frequency range.

The permittivity of the upper part 200 is also improved in relation to the permittivity of the initial support substrate 10 (silicon), due to the presence of the second material (silicon dioxide) in the trenches 2.

The density of the first zone 11 and second zone 21 are chosen so as to maintain an average thermal conductivity of the support substrate 10 greater than 20 W/m·K, this is achieved by varying the dimensions (in the X, Y plane) of the second zone 21.

Finally, the stability of the RF performances above 100° C. can be improved in the upper part 200 of support substrate 10 because of the presence of the third material 23 (polycrystalline silicon) on the internal walls of the trenches 2, the third material 23 advantageously having the properties of trapping movable electrical charges since at least a part of the thermal carriers generated in the first semiconductor material 10' between the trenches 2 is going to be trapped at the level of the third material 23 over the entire depth of the trenches 2, to provide the upper part 200 with a more stable effective resistivity over a wide range of temperatures.

Effective resistivity performances at room temperature, permittivity and substantially similar thermal conductivity are expected with a substrate 102 as illustrated in FIG. 6, Panel (a), formed, for example, of a support substrate 10 made of monocrystalline silicon with a nominal resistivity at 8 kohms-cm, of a gas or gas mixture as the second material 20 (air or nitrogen at atmospheric pressure or lower controlled pressure), the trenches 2 having a depth of 20 microns; the dielectric layer 30 is also made of silicon dioxide and the useful layer 40 is made of monocrystalline silicon.

According to another example, a substrate 102 based on FIG. 6, Panel (a), whose second material 20 (filling the trenches 2) is made of highly resistive poly-silicon should have improved performances with respect to the stability of effective resistivity over a wide range of temperatures and the thermal conductivity of the upper part 200; the permittivity of the upper part 200 would, on the other hand, remain close to that of the support substrate 10 (silicon).

According to yet another example, let us take the case of a substrate 102 as illustrated in FIG. 6, Panel (c), formed from a monocrystalline silicon support substrate 10 with a nominal resistivity at 8 kohms-cm, of a deposited polycrystalline silicon as the third material 23, of a second material of deposited silicon dioxide or silicon nitride, the trenches 2 having a depth of 20 microns; the additional layer 24 is made of poly-silicon, the dielectric layer 30 is also made of silicon dioxide and the useful layer 40 is of monocrystalline silicon.

The performances in terms of effective resistivity of the upper part 200 over high frequency ranges (typically up to 50 GHz) are still significantly improved compared to the previous examples: the effective resistivity reaches values up to 30 kohms-cm. In this example, the presence of the additional layer 24 of third material 23 (poly-silicon) under the dielectric layer 30 makes it possible to effectively trap the free carriers generated in the first zones 11. The confinement (in the first zones 11) of the residual mobiles charges present in the first semiconductor material 10' makes it possible to further increase the effective resistivity of the upper part 200 of support substrate 10.

The maximum size of the first zones 11 is advantageously chosen depending on the devices that will be produced on substrate 102 and specifically depending on their size: for example, for an antenna switch-type device comprising transistors characterized by a channel length less than 0.3 microns and a channel width greater than 500 microns, the maximum dimension (in the X, Y planes in the figures) of the first zones 11 will be chosen from around 1 micron.

Generally, the maximum dimension of the first zones 11 and the dimensions of the second zone 21 are chosen so that each component "sees" substrate 102 as a substantially homogeneous substrate, i.e., the device should neither be laid out solely above a first zone 11 or solely above the second zone 21. It is beneficial that the component (in this case the transistor) has at least one dimension which extends over a plurality of first zones 11. This makes it possible in particular to limit the inhomogeneous mechanical constraints at the level of the components, capable of generating greater dispersion in the electrical features of the components.

The depth of the trenches 2, and thus the thickness of the upper part 200 of substrate 101, is also defined according to the type of RF devices that will be produced on substrate 102 (or on substrate 100 or 101). Specifically, this depth is chosen based on the power generated by the devices and the depth of penetration of the electromagnetic field in substrate 102. For example, for an antenna switch-type device switching a power of 1 watt, penetration of the field being around 50 microns, the depth of the trenches 2 will be selected to be of the order of 50 microns, being typically between 30 and 70 microns.

It is beneficial that for RF devices operating at frequencies greater than 100 MHz, the second material 20 or the third material when it is used has properties for trapping movable electrical charges that can be generated in the first semiconductor material 10', as previously shown in some examples of substrates 102.

Figure 7:
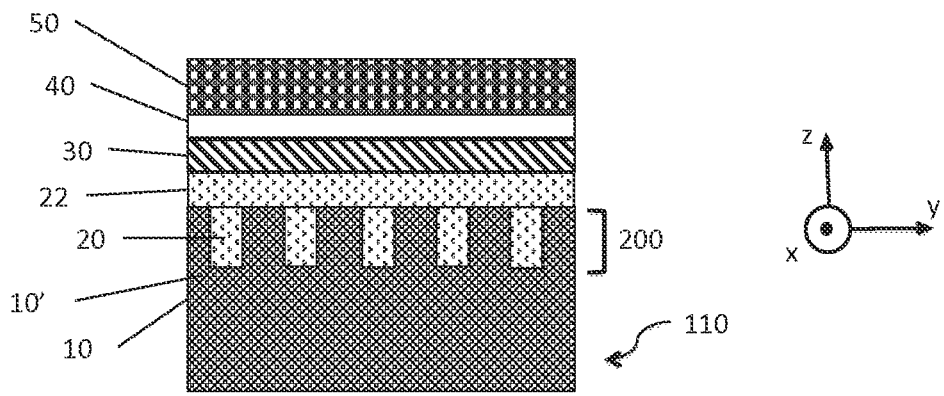
FIGS. 7 and 8 show structures of microelectronic radiofrequency devices according to the disclosure.

The disclosure also relates to a structure 110 of microelectronic radiofrequency devices (illustrated in FIG. 7) comprising:

A substrate 100 or 101 or 102 as previously described;

A layer of microelectronic devices 50 laid out directly on substrate 100, 101 or on the dielectric layer 30, which itself is laid out on substrate 100, 101.

According to an embodiment of the disclosure, the microelectronic device 50 of the structure 110 may be an antenna switch or adaptor or a power amplifier or a low-noise amplifier or a passive component (R, L, C).

As an illustration for the manufacture of this type of device, it will be possible to use a substrate 102 having a useful layer 40 made of silicon with a thickness of between 10 nm and 1.5 microns, for example, 145 nm, and an underlying dielectric layer 30 made of silicon oxide having a thickness of between 20 nm and 2 microns, for example, 400 nm; the first zones 11 have the shape of squares of 1 micron apart, spaced 2 microns apart and the upper part 200 extends over 50 microns thick (depth of the trenches 2 filled by the second material 20). The first semiconductor material 10' is monocrystalline silicon and the second material 20 is silicon nitride. Optionally, depending on the frequency of use of the targeted components, a layer of carbon-enriched polycrystalline silicon, corresponding to the third material 23, may line the walls of the trenches 2, sandwiched between the first semiconductor material 10' and the second material 20; it may have a thickness of a few dozens of nm to 200 nm. According to yet another option, an additional layer 24 of polycrystalline silicon may be sandwiched between the first side of the support substrate 10 and the dielectric layer 30; the additional layer 24 may have a thickness typically ranging from 100 nm to 1 micron.

The layer of microelectronic devices 50 developed in and on the useful layer 40 comprises a plurality of active components (of the MOS type, bipolar type, etc.) and a plurality of passive components (of capacitors, inductors, resistors, etc.).

The fabrication of the microelectronic components requires the implementation of several phases, including heat treatments at high temperatures, typically at 950-1100° C., or even beyond. The upper part 200 of structure 110, consisting of silicon (first semiconductor material 10'), silicon nitride (second material 20) and optionally carbon-enriched poly-silicon (third material) is able to withstand this type of treatment without undergoing any degradation likely to impact its RF properties.

Figure 8:
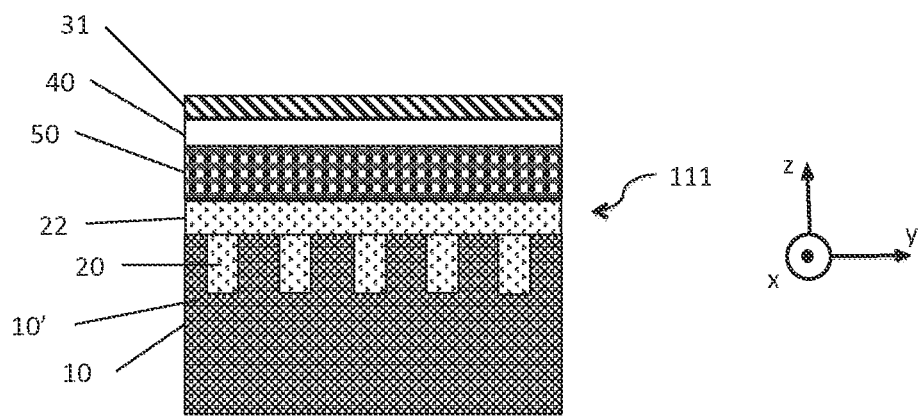

According to a variant, the layer of microelectronic devices 50 can be firstly developed on a substrate of the SOI type and then transferred by a layer transfer technique known to those skilled in the art onto substrate 100 or 101 according to the disclosure, to form a structure 111 illustrated in FIG. 8.

In FIG. 8, the structure 111 comprises, on the one hand, the support substrate 10 comprising the plurality of trenches 2, filled with the second material 20, on which is optionally laid out a residual layer 22 made of a second material 20 acting as a dielectric layer. Above the latter, there is the layer of microelectronic devices 50: the so-called "back end" portion of layers of metallic interconnections and dielectrics is laid out above the residual layer 22, the so-called "front end" portion (silicon), developed partly in the useful layer 40, being itself above the back-end part. Finally, above the useful layer 40, and optionally, there is a dielectric layer 31.

In both cases mentioned above, the electromagnetic fields resulting from the high-frequency signals intended to be spread in the microelectronic devices 50 and which will penetrate into substrate 100, 101, 102 will suffer only slight losses (insertion losses) and distortions (harmonics), due to the effective resistivity, greater than the nominal resistivity of the first semiconductor material 10' of the support substrate 10 or at least greater than 1,000 ohms-cm and stable over the entire operating temperature range (−40° C. to 150° C.), of the upper part 200 of the structure 110, 111: in fact, the configuration of the upper part 200 according to the disclosure blocks the movement of the mobile charges in the semiconductor substrate (coming from the parasitic conducting layer or thermal donors). Advantageously, the structure 110, 111 will have favorable heat dissipating properties, the first material being silicon. Also advantageously, the capacitive coupling between the layer of microelectronic devices 50 and the support substrate 10 will be greatly reduced due to the average permittivity of the upper part 200, reduced compared to that of the silicon due to the presence of the trenches filled with the second material (highly resistive or insulating).

According to another embodiment of the disclosure, the microelectronic device 50 of the structure 110, 111 may consist of a radiofrequency MEMS (Micro Electro-Mechanical Systems) component, comprising, for example, at least one control element and a MEMS switching element consisting, for example, of a microswitch with ohmic contact or a capacitive microswitch.

One of the substrates 100, 101, 102 may be used as a support substrate for the MEMS component; the fabrication of the MEMS part is then based on successive coatings of a plurality of layers (including an electrode, a dielectric, a sacrificial layer, an active layer) and by making patterns on these different layers.

The first zones 11 will, for example, be in the form of hexagons of 10 microns apart, spaced 10 microns apart, and the upper part 200 will extend over 50 microns thick (depth of the trenches 2 filled by the second material 20). The first semiconductor material 10' may be monocrystalline silicon and the second material 20 made of the silicon nitride.

The microelectronic processes for manufacturing the control element(s) (CMOS, for example), usually carried out before the MEMS part, require, as in the previous embodiment, the application of heat treatments at high temperatures.

According to a variant of the disclosure, which can be applied to all the embodiments described, the mesh formed by the second zone 21 on the first side 1 of substrate 100 may be located in specific regions of the first side. It will thus be possible to have a plurality of second zones 21 distributed over the first side 1 of substrate 100. In the areas of the first side 1 lacking these second zones 21, therefore, is found only the first semiconductor material 10' of the support substrate 10. The control elements (CMOS) of the device, if they do not require an underlying substrate with resistivity, restrictive permittivity properties such as RF elements, may be developed in areas devoid of second zones 21 (i.e., without trenches 2).

As mentioned above, the high-frequency signals propagating in this microelectronic device 50 generate electromagnetic fields (notably at the level of the MEMS switching elements) which penetrate into the support substrate 10. The losses (insertion losses), distortions (harmonics) and disruptions will be less because of the high and stable effective resistivity of the upper part 200 of the support substrate 10 comprising trenches filled with the second material 20.

Advantageously, the structure 110,111 will have favorable heat dissipating properties, the first material being silicon. Also advantageously, the capacitive coupling between the layer of microelectronic devices 50 and the support substrate 10 will be greatly reduced due to the average permittivity of the upper part 200, reduced compared to that of the silicon due to the presence of the trenches filled with the second material (highly resistive or insulating).

According to yet another embodiment of the disclosure, the microelectronic device 50 of the structure 110, 111 may consist of a radiofrequency filter, operating by bulk acoustic wave propagation (called "BAW" for "Bulk Acoustic Wave" or by acoustic propagation (known as "SAW" for "Surface Acoustic Wave") or any other acoustic propagation mode.

The manufacture of a SAW filter requires, for example, a useful layer 40 made of a piezoelectric material, on the surface of which an electrode comb will be developed: the acoustic wave is intended to spread between these electrodes. The structure 110 according to the disclosure may thus comprise, as an illustration, a useful layer 40 of lithium tantalate with a thickness of between 200 nm and 20 µm.

The first zones 11 may have a circular shape of 5 microns in diameter, spaced 5 microns apart and the upper part 200 may extend over 100 microns in thickness (trench 2 depth). The first semiconductor material 10' is monocrystalline silicon and the second material 20 may be air or amorphous or polycrystalline silicon. A dielectric layer 30 may optionally be added between the useful layer 40 and the first side 1 of the support substrate 10.

The structure 110, in addition to being naturally more stable in temperature than a solid piezoelectric substrate, makes it possible to obtain better filter performance, notably in terms of insertion losses and linearity.

The substrates 100, 101, 102 and the structures 110, 111 for radiofrequency applications according to the disclosure are not limited to the embodiments mentioned above. They are suitable for any application for which high frequency signals spread and are liable to suffer undesired losses or disturbances in a support substrate: indeed, the physical and electrical features of the upper part 200 of the substrate confer on the assembly good RF properties (limiting losses, non-linearities and other disturbances), stable over the entire operating temperature range. They also confer good thermal conductivity properties and a relative permittivity of less than 11 allowing a weak capacitive coupling between the active layer and the support substrate 10. By choosing the dimensions of the first zone 11 and second zone 21 and the nature of the first semiconductor material 10', second material 20 and potentially 3rd materials, it is possible to give priority to certain performances (effective resistivity, stability in temperature, thermal conductivity, permittivity) over others; depending on the applications, compromises can thus be found, on the one hand, to meet the specifications of the microelectronic devices to be developed, but also to meet the manufacturing cost of substrate 100, 101, 102 thus enabling its mass adoption.

The substrates 100, 101, 102 and the structures 110, 111 according to the disclosure may specifically be of interest for devices combining RF functions with high-performance digital or analogue functions (i.e., with high operating frequencies $f_T$, $f_{max}$).

In some cases, the digital and/or analogue functions do not require a resistive substrate that has the properties according to the disclosure: the upper part 200 of the substrate according to the disclosure, comprising the trenches filled with the second material 20, can then be local and not present on the entire substrate 100, 101, 102. There is thus a plurality of second zones 21 on the first side 1 of the substrate, located in different regions of the first side. In the areas of the first side 1 lacking these second zones 21, therefore, is found only the first semiconductor material 10' of the support substrate 10. The digital and/or analogue functions of the device, if they do not require an underlying substrate with resistivity, restrictive permittivity properties such as RF components, may be developed in areas lacking second zones 21 (i.e., without trenches 2).

Of course, the disclosure is not limited to the embodiments and examples described, and variants can be provided without departing from the scope of the invention as defined by the claims.

The invention claimed is:

1. A substrate for microelectronic radiofrequency devices comprising:
 a support substrate comprising a first semiconductor material having a resistivity greater than 500 ohms-cm; and
 a plurality of trenches in the support substrate partially filled with a second material and partially filled with a third material, the third material having a composition different than the second material, the plurality of trenches defining a plurality of first zones on a first side of the first semiconductor material and at least one second zone of a second material, the second material having a resistivity greater than 10 kohms-cm, the plurality of first zones having a maximum lateral dimension of less than 10 microns, the plurality of first zones being isolated from one another by the at least one second zone.

2. The substrate of claim 1, wherein a surface density of the plurality of first zones and the at least one second zone confers on an upper part of the substrate extending from the first side of the support substrate to a depth of the plurality of trenches, an average thermal conductivity greater than 20 W/m·K, an average dielectric permittivity lower than the permittivity of the first semiconductor material, and a resistivity higher than the resistivity of the first semiconductor material.

3. The substrate of claim 1, wherein the at least one second zone forms a mesh on the first side of the support substrate.

4. The substrate of claim 1, wherein the depth of the plurality of trenches is between 1 micron and 100 microns.

5. The substrate of claim 1, wherein the first semiconductor material comprises silicon.

6. The substrate of claim 1, wherein the second material partially filling the plurality of trenches is selected from the group consisting of silicon oxide, silicon nitride, silicon oxynitride, aluminum nitride, amorphous or polycrystalline silicon, carbon-rich silicon, a polymer, or a gas.

7. The substrate of claim 1, wherein the third material is located on internal walls defining the plurality of trenches and the second material is located on a side of the third material opposite the first semiconductor material of the support substrate.

8. The substrate of claim 1, wherein the third material is selected from the group consisting of silicon oxide, silicon nitride, silicon oxynitride, aluminum nitride, amorphous or polycrystalline silicon, carbon-rich silicon, a polymer, or a gas.

9. The substrate of claim 1, further comprising a dielectric layer on the first side of the support substrate.

10. The substrate of claim 9, further comprising an additional layer between the dielectric layer and the first side of the support substrate comprised of the third material.

11. The substrate of claim 9, wherein the dielectric layer comprises a material selected from the group consisting of silicon oxide, silicon nitride, silicon oxynitride, or aluminum nitride.

12. The substrate of claim 9, wherein the dielectric layer is comprised of the second material.

13. The substrate of claim 1, further comprising a useful layer on the first side of the support substrate.

14. The substrate of claim 13, further comprising a dielectric layer on the first side of the support substrate, wherein the dielectric layer is sandwiched between the useful layer and the first side of the support substrate.

15. The substrate of claim 13, wherein the useful layer comprises a material selected from a group consisting of a semiconductor material, an insulating material, a conductive material, or a piezoelectric material.

16. A microelectronic device structure, comprising:
a substrate as recited in claim 1; and
a layer of microelectronic devices on the substrate.

17. The microelectronic device structure of claim 16, wherein at least one of the microelectronic devices comprises an antenna switch, an adaptor, a power amplifier, a low noise amplifier, a passive component, a high frequency circuit, a radio frequency MEMS component, or a radiofrequency filter.

18. A method for manufacturing a substrate for microelectronic radiofrequency devices, comprising:
providing a support substrate comprising a first semiconductor material having a resistivity greater than 500 ohms-cm, the support substrate having a first side;
etching, according to a mask, a plurality of trenches extending from the first side of the support substrate to a determined depth within the support substrate;
partially filling the plurality of trenches with a third material; and
filling remainders of the plurality of trenches with a second material to form first zones of a first material and at least one second zone on the first side of the second material, the first zones having a maximum lateral dimension of 10 microns or less, the first zones being insulated from one another by the second zone, the second material having a resistivity greater than 10 kohms-cm, the second material having a composition different than the third material.

19. A method for manufacturing a substrate for microelectronic radiofrequency devices, comprising:
providing a support substrate comprising a first semiconductor material having a resistivity greater than 500 ohms-cm;
depositing, according to a mask, a plurality of pillars made from the first material and of a determined height, on the support substrate, an upper surface of the pillars defining a first side of the substrate, the pillars being insulated from each other by a plurality of trenches extending from the first side of the support substrate to a depth within the support substrate defined by the determined height of the pillars;
partially filling the plurality of trenches with a third material; and
filling remainders of the plurality of trenches with a second material to form first zones of the first material and at least one second zone on the first side of the second material, the first zones having a maximum lateral dimension of 10 microns or less, the first zones being insulated from one another by the at least one second zone, the second material having a resistivity greater than 10 kohms-cm, the second material having a composition different than the third material.

* * * * *